United States Patent [19]

Ignowski et al.

[11] Patent Number: 5,635,935

[45] Date of Patent: Jun. 3, 1997

[54] POWER REDUCTION TECHNIQUE FOR CURRENT MODE DIGITAL-TO-ANALOG CONVERTERS

[75] Inventors: James S. Ignowski; Hugh Wallace; Stuart A. Bell, all of Fort Collins, Colo.

[73] Assignee: Hewlett-Packard Company, Palo Alto, Calif.

[21] Appl. No.: 522,011

[22] Filed: Aug. 31, 1995

[51] Int. Cl.⁶ .................................................. H03M 1/66
[52] U.S. Cl. ........................ 341/135; 341/136; 327/544
[58] Field of Search ................................. 341/118, 135, 341/136, 144; 327/544

[56] References Cited

U.S. PATENT DOCUMENTS

| | | | |
|---|---|---|---|
| 4,868,904 | 9/1989 | Gravrok et al. | 307/443 |
| 5,021,684 | 6/1991 | Ahuja et al. | 307/443 |
| 5,481,178 | 1/1996 | Wilcox et al. | 323/287 |
| 5,489,902 | 2/1996 | Shyu et al. | 341/136 |

*Primary Examiner*—Marc S. Hoff
*Attorney, Agent, or Firm*—Patrick J. Murphy

[57] ABSTRACT

A video DAC for driving video displays with reduced power dissipation is presented. This is accomplished using a dual driver circuit connected to a current mirror, the dual driver comprising a strong driver and a weak driver. The dual driver permits switching current between the video load and a dummy load. The current to the dummy load is disabled during periods when the video signal remains steady for a predetermined period of time. The dual driver, using the weak driver, disables the current to the dummy load during video blanking and synchronization periods. This scheme substantially reduces the power dissipation in the DAC.

8 Claims, 4 Drawing Sheets

POWER REDUCTION TECHNIQUE FOR CURRENT MODE DIGITAL-TO-ANALOG CONVERTERS

FIELD OF THE INVENTION

The present invention relates generally to video displays and more particularly to a current mode digital-to-analog converter in a video display subsystem.

BACKGROUND OF THE INVENTION

Video subsystems for driving video displays typically employ video digital-to-analog converters (DACs). The video DAC can generate a variety of discrete current levels which are sent to the video display via a transmission line. Within a color graphics system, colors are created by "mixing" the three primary colors—red, green and blue (RGB).

Color images are typically stored in color maps by allocating twenty-four (24) bits/pixel (i.e., 8 bits for red, 8 bits for green and 8 bits for blue). Each of these 8 bit codes range from 0 to 255. If every bit is used, this 8:256 decoding scheme allows for a "photo-quality" color system. Video DACs convert the 8 bits of digital information into an analog signal, such as an analog current.

An 8-bit CMOS video DAC for generating either red or blue is typically fabricated by using 276 switchable current cells in the following proportion: (a) 255 cells for video information; and (b) 21 cells for the blanking period. A green video DAC typically adds 110 switchable current cells for a synchronization (sync) signal. In addition, control cells are used to actuate the current cells. The sync signal is usually placed within the green channel, although sync in either the red or blue channel is possible.

Typically, the process of switching the current cells on and off during normal operation creates transient noise on the chip which can couple to the power supply. This noise occurs when current cells are switched because the power supply current changes in step amounts and the inductive nature of the lead frame pins and bond wires reacts to these changes by causing the supply voltage to "bounce." One common approach to address this problem involves putting a "dummy" load resistor on the chip which roughly approximates the resistive component of the off-chip video load. The output of the current cells is then steered between the off-chip video load (when the cell is 'on') and the on-chip dummy load resistor (when the cell is 'off'). This results in a reduction in the electrical noise associated with the switching of the DAC output current levels, particularly in the power supply, because the supply current drawn by the DAC remains essentially constant and the supply voltage does not bounce. However, the current running through the on-chip dummy load resistor substantially increases the power dissipation in the DAC, giving rise to thermal and power supply current issues.

SUMMARY OF THE INVENTION

The present invention provides a video digital-to-analog converter (DAC) which uses a dual load scheme while minimizing overall power dissipation. The present DAC comprises a dual driver circuit connected to a current mirror. Power dissipation is reduced by turning off the current flowing to a dummy load resistor during video blanking and synchronization. Thus, the current mirror generates an output current signal characterized by reduced power supply noise. The dual driver circuit, comprising a strong driver and a weak driver, ensures that the appropriate dummy load currents are not disabled until the DAC is in the proper mode of operation. The dual driver circuit also ensures that the dummy load currents are enabled prior to video data being sent. Additionally, the dual driver circuit provides two switching speeds to inhibit further noise.

DETAILED DESCRIPTION OF THE PREFERRED EMBODIMENT

Broadly, the present invention provides a video digital-to-analog converter (DAC) with reduced power dissipation. This is accomplished using a dual driver circuit, the dual driver comprising a strong driver and a weak driver. The dual driver permits switching current between the video load and a dummy load. The current to the dummy load is disabled during periods when the video signal remains steady for a predetermined period of time. This scheme substantially reduces the power dissipation in the DAC.

Figure 1:
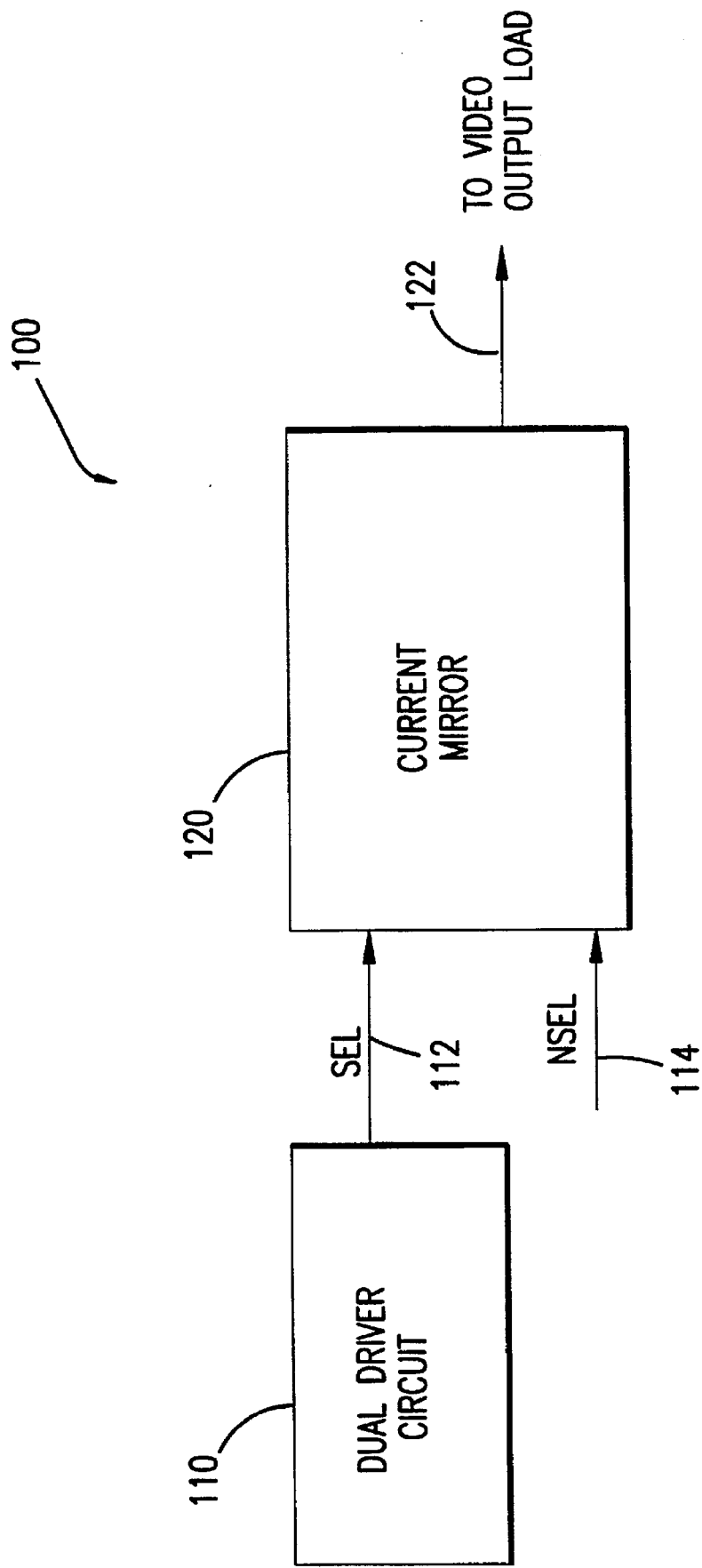
FIG. 1 shows a block diagram of a current cell in a digital-to-analog converter (DAC) with reduced power dissipation according to the present invention.

FIG. 1 shows a block diagram of a current cell of a DAC with reduced power dissipation according to the present invention. The current cell 100 comprises a dual driver circuit 110 connected to a current mirror 120. Two control signals, SEL 112 and NSEL 114, control the current mirror 120. The SEL signal 112 is generated by the dual driver circuit 110 while the NSEL signal 114 is generated by a control circuit (not shown). The current mirror 120 generates an output current signal 122 characterized by a reduced power supply noise signal.

Figure 2:
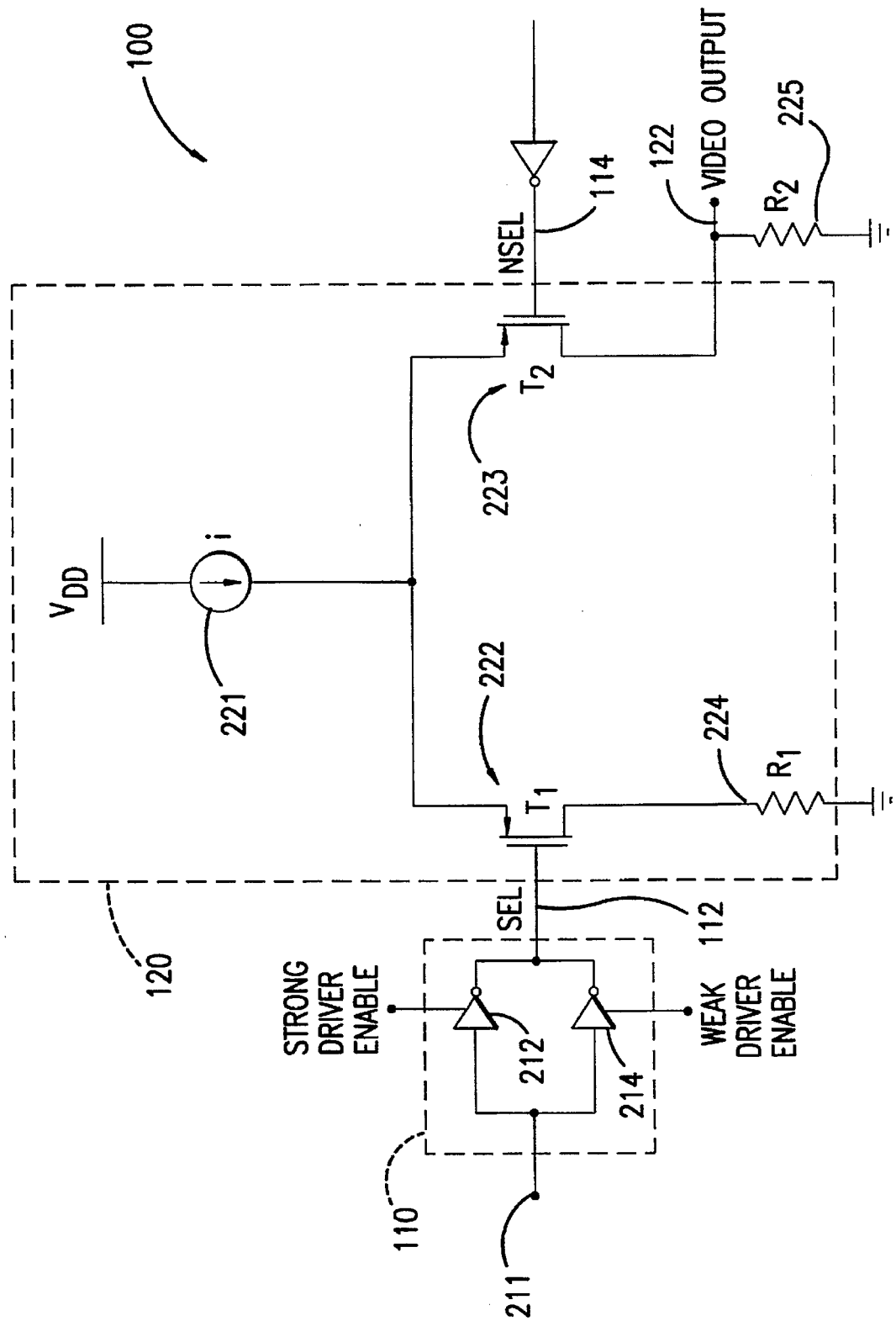
FIG. 2 shows one embodiment of the reduced power dissipation DAC current cell.

FIG. 2 shows one embodiment of the reduced power dissipation DAC current cell according to the present invention. The dual driver circuit 110 comprises first and second inverters 212,214, each connected to input node 211. The first inverter 212 is connected to a strong driver enable signal while the second inverter 214 is connected to a weak driver enable signal. In one preferred embodiment, the first inverter 212 is larger than the second inverter 214. In another preferred embodiment, the first inverter 212 is at least 10 times larger than the second inverter 214. In another preferred embodiment, the ratio of the first inverter 212 to the second inverter 214 with respect to size is 70:1. This sizing was optimized for the different timing needs of the operating modes as will be discussed below.

The SEL signal 112, which is generated by the dual driver circuit 110, is connected to the gate terminal of transistor $T_1$ 222. The drain terminal of $T_1$ 222 is connected to resistor $R_1$ 224 which represents the dummy load. In a preferred embodiment, $R_1$ 224 is 80 ohms, which is a slightly higher resistance than the off-chip video load which is typically 75 ohms.

A current source i 221 is connected to the source terminals of $T_1$ 222 and transistor $T_2$ 223. Current source i 221 is powered by $V_{op}$. In a preferred embodiment, $V_{DD}$ is 5 volts. $V_{DD}$ equal to either 3 volts or 4 volts can also be used. The current mace i 221 is preferably 70 microamps. The drain terminal of $T_2$ 223 is connected to the video output load. A termination resistor $R_2$ 225 is connected from the video load to ground. The gate terminal of $T_2$ 223 is connected to the NSEL signal 114 which is derived from the control circuit (not shown).

Figure 3:
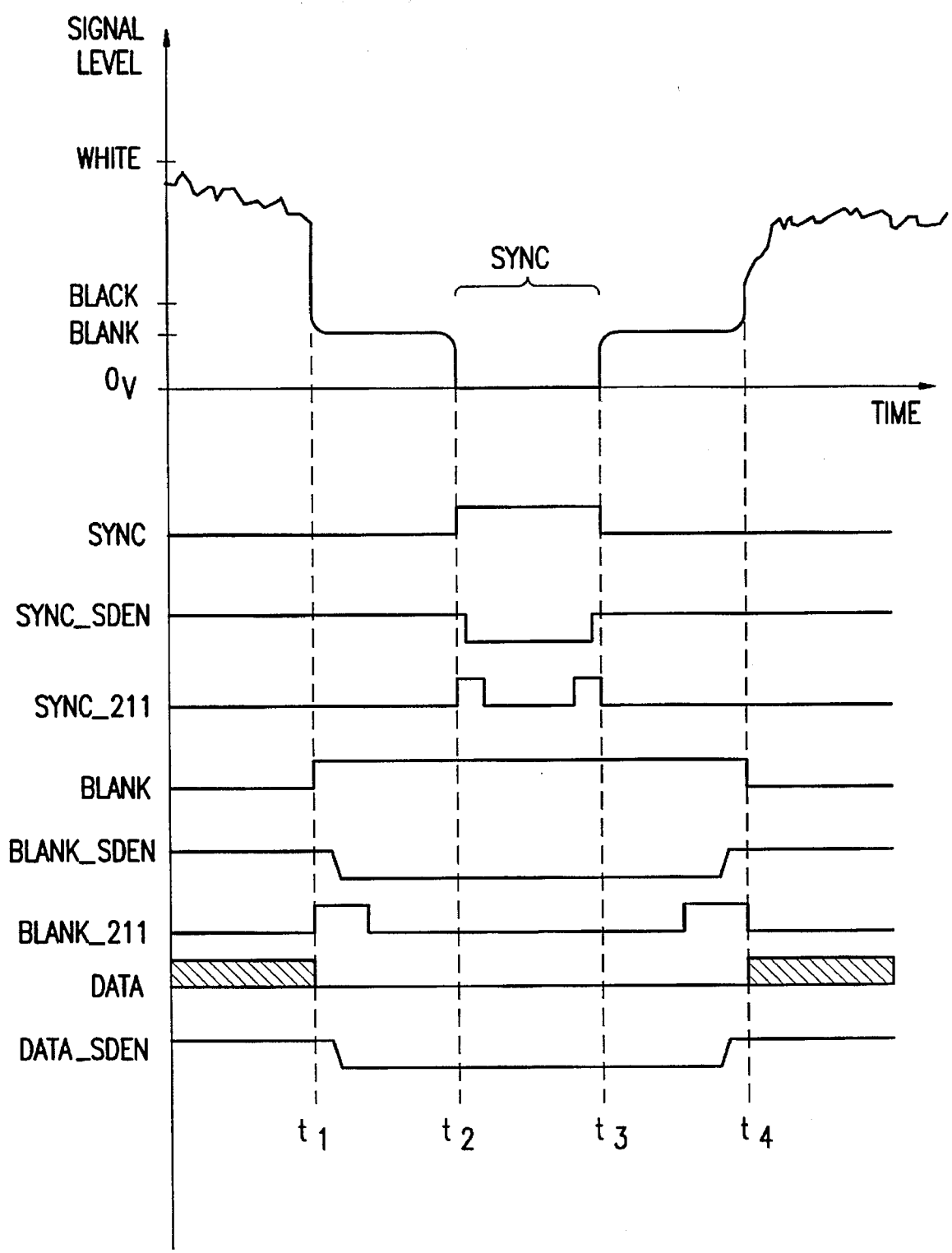
FIG. 3 shows a timing diagram for the reduced power dissipation DAC.

The operation of the DAC with reduced power dissipation will now be discussed with reference to FIG. 2 and FIG. 3, which shows a timing diagram for the reduced power dissipation DAC. The basic idea is to turn off the current in the dummy load by bringing signal SEL (item 112 in FIG. 2) high for the current cells which will not be turned on in the immediate future. This occurs once the video signal enters either a blank or sync state. During video blanking, the dummy load (i.e., $R_1$ 224) current may by disabled for the current cells responsible for video data and the front porch, substantially reducing the power dissipation in the DAC. During sync, the dummy load current may be disabled for the current cells responsible for the sync pedestal, in addition to the other current cells.

Care must be taken when bringing SEL high to avoid the noise problems associated with common video DACs. If the dummy load current is disabled by bringing SEL high with a very slow edge, the time derivative of supply current is small enough that the noise voltage developed across the bond wires and lead frame is negligible. This is accomplished by using the weak driver (item 214 in FIG. 2) to drive SEL when turning the dummy load current on and off, and using the strong driver (item 212 in FIG. 2) when passing normal video signal data. Because of the slow edges from the weak driver, it must be given multiple pixel clock periods for its output to rise and fall. The weak driver is enabled when the strong driver is disabled.

The control signals for disabling the strong driver are generated by looking back upstream in the pipelined data flow through the video processing circuitry (not shown). Basic functional signals, such as SYNC, BLANK and DATA, represent the digital video signal that is the input to the DAC. Referring to FIG. 3, a representative video signal is shown. The brightness amplitude for white video and black video are indicated, along with the blank amplitude, which has a lower amplitude than black, and sync, which in a preferred embodiment is 0 volts. Time 1 to $t_1$ represents the active video period, or DATA. Time period $t_1$ to $t_2$ is the front porch of the blanking period; $t_2$-$t_3$ is the period for sending the sync pulse; $t_3$-$t_4$ is the back porch of the blanking period. It is important that the appropriate dummy laod currents must not be disabled until after the DAC has reached the blanking period (i.e., after $t_1$) and that these currents must be enabled prior to leaving sync or blank (i.e., before $t_4$).

Signals with "_SDEN" appended to the name represent the strong driver enable signals for the respective video signals. Signals with the "_211" appended to the name represent the signal seen at node 211 in FIG. 2.

All video signals are treated in a similar fashion. SYNC will be used as an example. During normal video data operation, the sync current cells are on, outputting their current to the video display. When the video signals goes into a sync period, SYNC and SYNC_211 go high. During this low-to-high transition of SYNC_211, its respective strong driver is enabled and the output currents of the current cells representing the sync portion of the output signals are switched to the dummy load in the normal (i.e., fast) fashion. Shortly after this transition, the sync strong drivers are disabled, SYNC_211 goes low, and the sync current cells which are driving current into the dummy load slowly turn off as the appropriate SEL signals (item 112) slowly rise and turn off the dummy current without generating appreciable electrical noise. Several close cycles prior to SYNC falling (i.e., the video system coming out of synchronization), SYNC_211 goes high again and the weak driver slowly pulls the appropriate SEL current back on. Shortly before SYNC goes low, SYNC_SDEN goes high, enabling the sync strong drivers, and SYNC and SYNC_211 go low simultaneously, switching their output current from the dummy load to the video display. In a similar fashion, the current cells which generate the blank and data portions of the video signal are turned on and off quietly to save the power dissipated in the dummy load without generating electrical noise.

The control circuit, which generates the control signals (e.g., SYNC_SDEN), can be implemented with any suitable logic, for example, as a state machine in a conventional field programmable gate array (FPGA) with the functionality described above.

Figure 4:
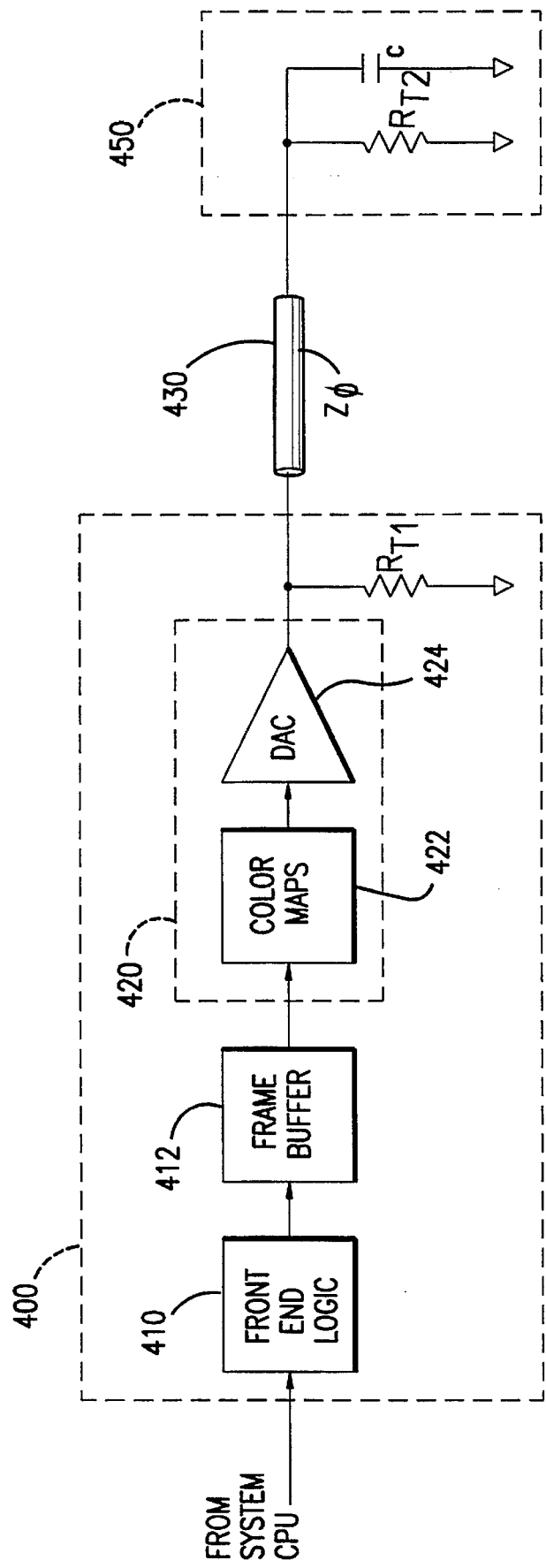
FIG. 4 shows a block diagram of a video subsystem within a computer system incorporating the present invention.

FIG. 4 shows a block diagram of a video subsystem within a computer system incorporating the present invention. A video subsystem 400 drives a video display 450. A transmission line 430 connects the video subsystem 400 with the video display 450. In a preferred embodiment, the transmission line 430 is a coaxial cable having an intrinsic impedance $Z_0$. The video subsystem 400 is connected to a central processing unit (CPU) (not shown), which may be located within a host computer or a dedicated graphics processor. The video subsystem 400 receives data and operational control signals from the CPU. In turn, the video subsystem 400 sends data and control signals along to the video display 450 via the transmission line 430. Termination resistors $R_{T1}$, $R_{T2}$ are disposed on either side of the transmission line 430 to minimize ringing along the transmission line 430. In a preferred embodiment, $R_{T1}$ and $R_{T2}$ are each 75 ohms. The video display 450 can be modeled as a capacitor between the transmission line 430 and ground, as shown in FIG. 4. In a preferred embodiment, the signals that are transmitted along the transmission line 430 between the video subsystem 400 and the video display 450 conform to the RS343 computer monitor analog standard.

The video subsystem 400 comprises front end logic 410, a frame buffer 412 connected to the front end logic 410, and a video digital-to-analog converter (DAC) 420 connected to the frame buffer 412. The front end logic 410 typically has dithering functionality, rasterization functionality, and other signal processing mechanisms and can be implemented, for example, using a field programmable gate array. The frame buffer 412 comprises a video random access memory (VRAM).

The video DAC 420 comprises color maps 422 (lookup tables) and a DAC 424 connected to the color maps 422. The DAC 424 converts digital color information (for one of the primary colors) into an analog signal which is then sent to the video display 450 via the transmission line. There are typically three color maps (lookup tables) for each of the three red-green-blue (RGB) colors. Additionally, there are three DACs which are then each connected to separate transmission lines. Each DAC may handle an 8-bit color word which yields 256 discrete steps for each color.

The operation of the video subsystem 400 is as follows. The CPU sends video data to the front end logic 410 which processes the data and places the data in the frame buffer 412. The video data is then passed onto the DAC 424 which uses the video data to lock up color data within the color map 422. The color data is then converted into an analog signal via the DAC 424 and transmitted to the video display 450 via the transmission line 430. The DAC 424 comprises a plurality of parallel current cells for collectively providing an analog current $i_o$ for driving the video display 450. Each of the current cells has a current source and switching mechanism for switching the current from the corresponding current source. In a preferred embodiment, each current cell is configured as the circuit illustrated in FIG. 2.

While the present invention has been illustrated and described in connection with the preferred embodiment, it is not to be limited to the particular structure shown. It should be understood by those skilled in the art that various changes and modifications may be made within the purview of the appended claims without departing from the spirit and scope of the invention in its broader aspects.

We claim:

1. A video DAC having reduced overall power dissipation, the video DAC comprising:

a current mirror having a current output and first and second inputs; and a dual driver circuit having an output, the output connected to the first input.

2. The video DAC of claim 1, wherein the dual driver circuit comprises first and second inverters, the first inverter being larger than the second inverter.

3. The video DAC of claim 2, wherein the first inverter is at least 10 times larger than the second inverter.

4. The video DAC of claim 3, wherein the current mirror comprises:

a voltage source;

a current source connected to the voltage source, the current source generates a current;

a first transistor having a first drain terminal, a first gate terminal and a first source terminal, the first source terminal connected to the current source, the first gate terminal connected to the dual driver circuit;

a second transistor having a second drain terminal, a second gate terminal and a second source terminal, the second source terminal connected to the current source and the first source terminal; and a resistor connected to the first drain terminal;

and wherein the dual driver circuit controls the switching of the current to the resistor thereby minimizing overall power dissipation.

5. The video DAC of claim 4, wherein the second drain terminal is connected to a video output load.

6. The video DAC of claim 5, wherein the resistor has a larger resistance than the video output load.

7. A video subsystem for driving a video display, the video subsystem resides within a computer system, the computer system having a CPU, the video subsystem comprising:

front end logic, the front end logic receives video data from the CPU;

a frame buffer connected to the front end logic, the frame buffer receives the video data from the front end logic;

a video DAC connected to the frame buffer, the video DAC converts the video data into an analog signal, the video DAC having at least one current cell, the at least one current cell switches current between a dummy load resistor and the analog signal using a dual driver circuit, the dual driver circuit having a strong driver and a weak driver.

8. The video subsystem of claim 7, wherein the current is disabled in the dummy load resistor when the video data is equal to a predetermined value indicative of a blanking period, the current being disabled using the weak driver.

* * * * *